(12) United States Patent
Jeon et al.

(10) Patent No.: US 12,068,771 B2
(45) Date of Patent: Aug. 20, 2024

(54) MODULAR CONTROL DEVICE AND VEHICLE USING SAME

(71) Applicant: LG ELECTRONICS INC., Seoul (KR)

(72) Inventors: Jongwook Jeon, Seoul (KR); Jaeho Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 100 days.

(21) Appl. No.: 17/785,345

(22) PCT Filed: Feb. 28, 2020

(86) PCT No.: PCT/KR2020/002870
§ 371 (c)(1),
(2) Date: Jun. 14, 2022

(87) PCT Pub. No.: WO2021/172629
PCT Pub. Date: Sep. 2, 2021

(65) Prior Publication Data
US 2023/0016638 A1  Jan. 19, 2023

(51) Int. Cl.
*B60R 16/023* (2006.01)
*H04B 1/3822* (2015.01)
(Continued)

(52) U.S. Cl.
CPC ....... *H04B 1/3822* (2013.01); *B60R 16/0239* (2013.01); *H05K 5/0065* (2013.01); *H04W 4/46* (2018.02)

(58) Field of Classification Search
CPC . G06F 1/26; G06F 3/038; G06F 1/266; G06F 3/0653; G06F 1/16; G06F 1/183;
(Continued)

(56) References Cited

U.S. PATENT DOCUMENTS

| 6,859,698 B2 | 2/2005 | Schmeisser |
| 9,989,005 B1* | 6/2018 | Silvestri ................. B60R 11/00 |
| 2019/0217781 A1* | 7/2019 | Tomar ................... B60J 3/0282 |

FOREIGN PATENT DOCUMENTS

| CN | 101349905 | 1/2009 |
| CN | 101996110 | 3/2011 |

(Continued)

OTHER PUBLICATIONS

The State Intellectual Property Office of the People's Republic of China Application Serial No. 202080000654.8, Office Action dated Apr. 15, 2023, 15 pages.

(Continued)

*Primary Examiner* — James Wu
*Assistant Examiner* — Dakota M Talbert
(74) *Attorney, Agent, or Firm* — LEE, HONG, DEGERMAN, KANG & WAIMEY

(57) ABSTRACT

A modular control device for a vehicle comprises: a base frame mounted on the vehicle; and an upgrade frame detachably mounted on the base frame. A first printed circuit board (PCB), on which a base block for providing an interface with devices in the vehicle is implemented, is mounted on the base frame. A second PCB having a memory and a main processor is mounted on the upgrade frame.

12 Claims, 9 Drawing Sheets

(51) Int. Cl.
  *H05K 5/00* (2006.01)
  *H04W 4/46* (2018.01)
(58) Field of Classification Search
  CPC ... G06F 11/3013; G06F 11/30; H04B 1/3822; H05K 5/0065; B60K 2370/589; B60K 2370/592; B60K 35/00; B60W 50/00; B60W 10/06; B60W 10/26; B60W 50/14; B60R 16/02
  See application file for complete search history.

(56) References Cited

FOREIGN PATENT DOCUMENTS

| CN | 201903811 | 7/2011 |
|---|---|---|
| CN | 104020759 | 9/2014 |
| CN | 208805714 | 4/2019 |
| CN | 109747480 | 5/2019 |
| CN | 110785742 | 2/2020 |
| JP | H08213133 | 8/1996 |
| JP | 2002095139 | 3/2002 |
| JP | 2004320940 | 11/2004 |
| KR | 200185461 | 7/2000 |
| KR | 100676624 B1 * | 1/2001 |
| KR | 100676624 | 1/2007 |
| KR | 1020110126291 | 11/2011 |
| KR | 10-1850458 | 4/2018 |

OTHER PUBLICATIONS

PCT International Application No. PCT/KR2020/002870, International Search Report dated Nov. 17, 2020, 3 pages.
The State Intellectual Property Office of the People's Republic of China Application Serial No. 202080000654.8, Office Action dated Sep. 22, 2023, 12 pages.
Korean Intellectual Property Office Application No. 10-2022-7017749, Office Action dated Mar. 18, 2024, 5 pages.

* cited by examiner

MODULAR CONTROL DEVICE AND VEHICLE USING SAME

CROSS-REFERENCE TO RELATED APPLICATION(S)

This application is the National Stage filing under 35 U.S.C. 371 of International Application No. PCT/KR2020/002870, filed on Feb. 28, 2020, the contents of which are all incorporated by reference herein in its entirety.

BACKGROUND OF THE DISCLOSURE

Field of the Disclosure

The present disclosure relates to a control device for a vehicle, and more particularly, to a modular control device and a vehicle using the same which are easy to upgrade.

Related Art

A vehicle is an apparatus which moves a passenger from one place to another place. A representative example is a car. A vehicle-to-everything (V2X) communication technology, which means vehicle-to-object communication, refers to a technology in which the vehicle communicates with other vehicles, pedestrians, road infrastructures, servers, and the like to provide a series of services.

For the V2X, standardization organizations such as Institute of Electrical and Electronics Engineers (IEEE), 3rd Generation Partnership Project (3GPP), etc. provide various communication specifications. Dedicated Short Range Communications (DSRC) is a communication standard protocol based on IEEE 802.11. The Long Term Evolution (LTE) and New Radio (NR) of the 3GPP also provide the communication protocol for the V2X.

In addition to the V2X, partially or fully autonomous vehicles are emerging. This autonomous vehicle needs to exchange more data with neighbor vehicles, pedestrians, servers, and the like with low latency and high reliability.

Recently a vehicle infotainment system is widely used with the development of vehicle technology. The vehicle infotainment system may be a system which integrally provides the information required for driving and road guidance, various amusement and human-friendly entertainment.

While various technologies such as autonomous driving or infotainment are applied to the vehicle, there are many difficulties in applying such technologies to the conventional vehicle. Generally, the durability of the vehicle is several years to more than ten years. The new technology requires much more processing power, which may be difficult to process with semiconductor processing devices in the vehicle that several years has elapsed.

As the new technology is applied, it may be needed to upgrade the infotainment system. A technique is required to make it easier to upgrade the infotainment system.

SUMMARY

The present disclosure provides an upgradeable modular control device and a vehicle using the same.

In an aspect, a modular control device for a vehicle includes a base frame which is mounted to the vehicle and an upgrade frame which is mounted detachably to the base frame. The base frame is mounted with a first printed circuit board (PCB) on which a base block for providing interfaces with devices in the vehicle is implemented. The upgrade frame is mounted with a second PCB having a memory and a main processor. The base frame includes a plurality of pins configured to match a location where the upgrade frame is mounted, a fasten hook configured to fix the upgrade frame to the base frame, and a fasten hole into which a fasten lever of the upgrade frame is inserted to fix the upgrade frame to the base frame by rotating the fasten lever.

In another aspect, a base frame for a modular control device for a vehicle includes a base body which is mounted with a printed circuit board (PCB) on which a base block for providing interfaces with devices in the vehicle is implemented, and mounted detachably to an upgrade frame, a plurality of pins configured to match a location where the upgrade frame is mounted, a fasten hook configured to fix the upgrade frame to the base frame, and a fasten hole into which a fasten lever of the upgrade frame is inserted to fix the upgrade frame to the base frame by rotating the fasten lever.

In still another aspect, a vehicle includes an engine, a display device which displays driving information of the vehicle to a driver, and a modular control device which provides the driving information to the display device. T the modular control device includes a base frame which is mounted to the vehicle, and an upgrade frame which is mounted detachably to the base frame.

The upgradeable control device is provided based on the functions of the vehicle.

BRIEF DESCRIPTION OF THE DRAWINGS

FIG. 6 is a diagram illustrating a booting operation of the modular control device when the engine of the vehicle is turned on.

DESCRIPTION OF EXEMPLARY EMBODIMENTS

Figure 1:
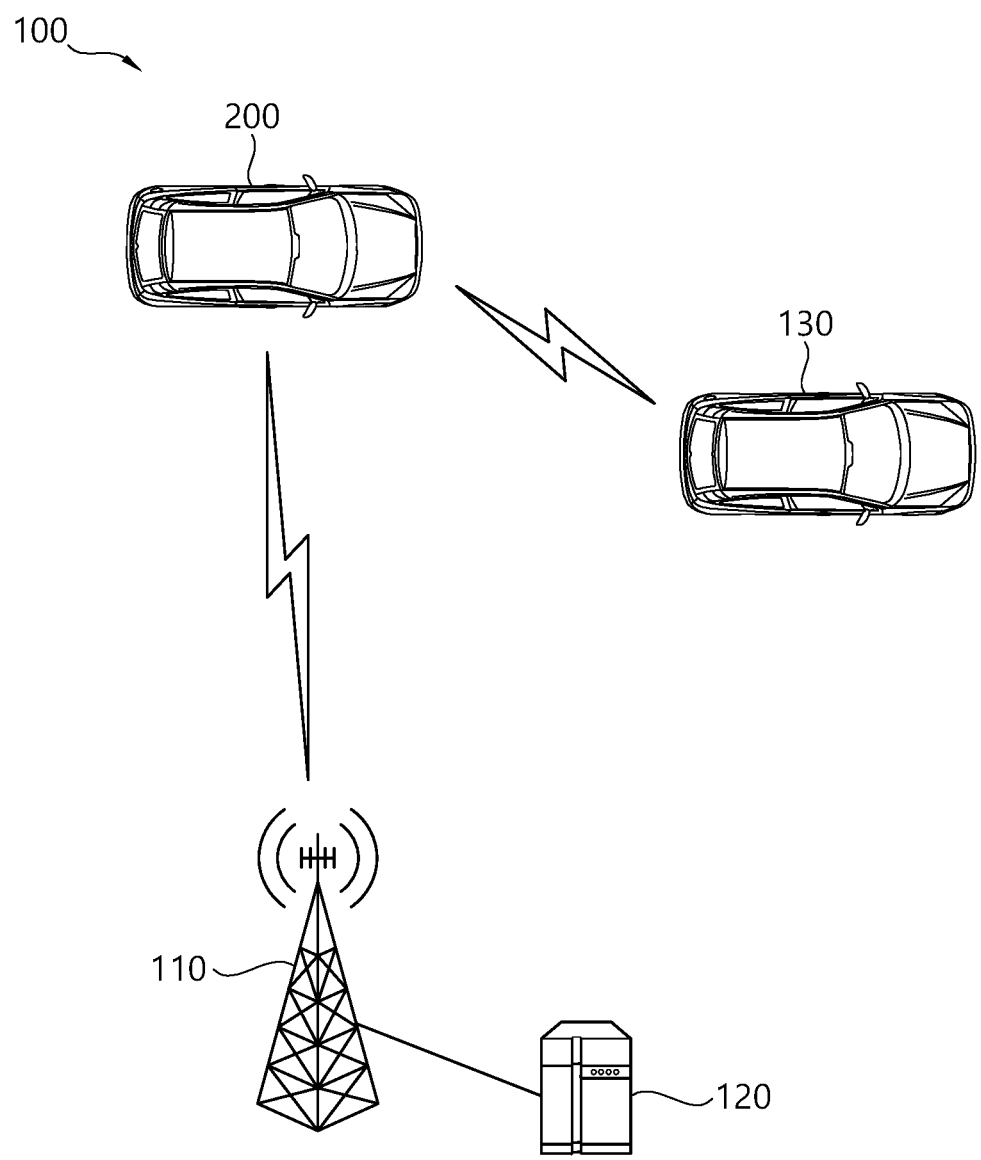
FIG. 1 is a diagram illustrating a system to which an embodiment is applied.

Hereinafter, embodiments disclosed in the present disclosure will be described in detail with reference to the accompanying drawings, and the same or like components are denoted by the same reference numerals regardless of the reference numerals, and redundant description thereof will be omitted. The suffixes "module" and "unit" for the components used in the following description are given or mixed in consideration of ease of writing the disclosure, and do not have distinct meanings or roles in itself. In addition, in the description of the embodiments disclosed in the present disclosure, if it is determined that the detailed description of the related known technology may obscure the subject matter of the embodiments disclosed in the present disclosure, the detailed description thereof will be omitted. In addition, the accompanying drawings are intended merely for facilitating understanding of the embodiments disclosed in the present disclosure, and the technical subject matters disclosed in the present disclosure is not limited by the accompanying drawings.

Terms including ordinal numbers such as first and second may be used to describe various components, but the components are not limited by the terms. The terms are used only for the purpose of distinguishing one component from another component.

When a component is said to be "connected" or "coupled" to another component, it may be directly connected to or coupled to another component, but it should be understood that other components may exist therebetween. On the other hand, when a component is said to be "directly connected" or "directly coupled" to another component, it should be understood that there exist no other components therebetween.

Singular expressions include plural expressions unless the context clearly indicates otherwise.

In the present application, it should be understood that the term "comprises", "having", or the like is intended to indicate that there exists a feature, a number, a step, an operation, a component, a part, or combination thereof described in the disclosure, and does not exclude the possibility of the presence or the addition of one or more other features, numbers, steps, operations, components, parts, or a combination thereof in advance.

In the following description, the left of the vehicle means the left of the forward driving direction of the vehicle, and the right of the vehicle means the right of the forward driving direction of the vehicle.

FIG. 1 illustrates a system to which an embodiment is applied.

A system 100 includes a vehicle 200, a base station 110, and a server 120. The vehicle 200 may communicate with the base station 110 and/or a surrounding vehicle 130 by using a wireless communication protocol. The wireless communication protocol has no limitations, and may include, for example, Dedicated Short Range Communications (DSRC) or WiFi based on the Institute of Electrical and Electronics Engineers (IEEE) 802.11, and/or cellular communications based on the 3rd Generation Partnership Project (3GPP) (for example, Wideband Code Division Multiple Access (WCDMA), Long Term Evolution (LTE), New Radio (NR), and the like).

The base station 110 may communicate with the vehicle 200 or other base stations by using various wireless communication protocols such as DSRC, LTE, NR, and WiFi.

The server 120 includes computing hardware which is connected to one or more base stations 110 to provide autonomous driving data services to the vehicle 200. For example, the computing hardware may include a processor and a memory. The memory may store map data and driving environment information which are described in the following embodiments, and the processor may provide this data to the vehicle 200. The processor may update the map data based on the data which is received from the one or more vehicles 200.

The vehicle 200 may include various types of automobiles, trucks, airplanes, boats, and the like for transporting people or objects. The vehicle 200 may use an internal combustion engine and/or an electric motor as a power source. The vehicle 200 may be configured to operate autonomously. The autonomous driving refers to, for example, driving without the assistance of a human driver. In the autonomous driving mode, the vehicle 200 may be configured to detect the neighbor vehicle 130 and determine the trajectory of the detected vehicle. The vehicle 200 may exchange information by communicating with the neighbor vehicle 130. The vehicle 200 may switch between the autonomous driving mode and the manual driving mode. Even in the manual driving mode, the vehicle 200 may provide useful route information to the driver, or support various Advanced Driver Assistance Systems (ADAS).

Figure 2:
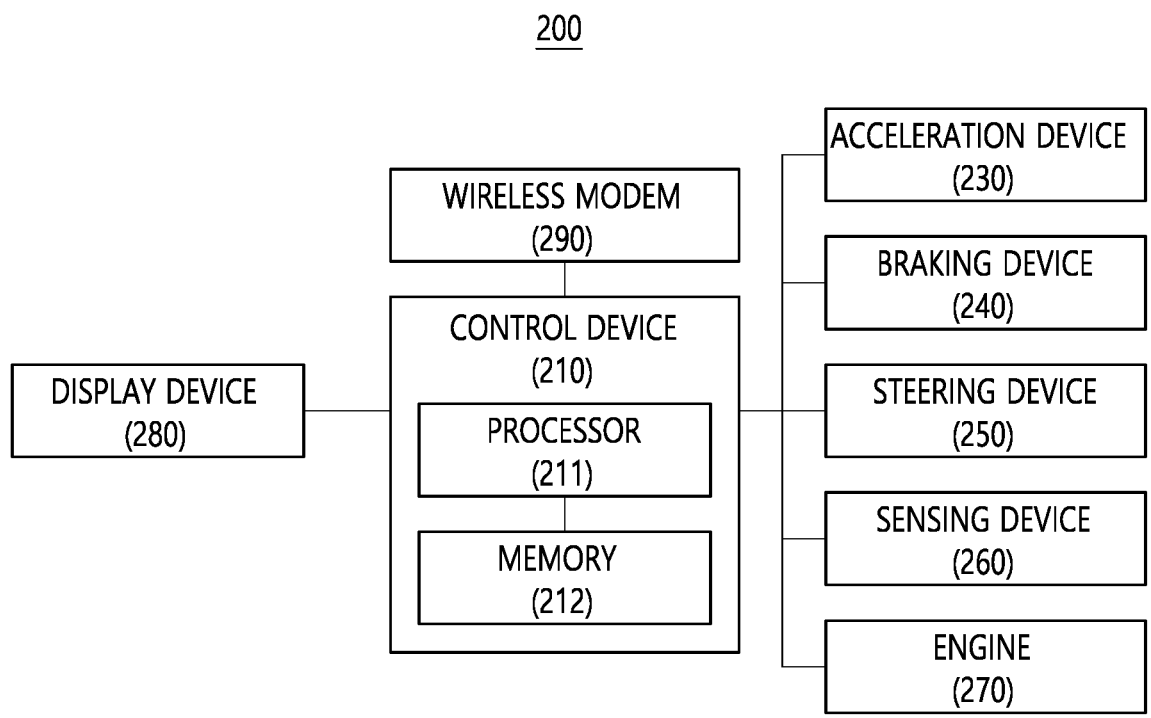
FIG. 2 is a block diagram illustrating a vehicle which implements the present embodiment.

FIG. 2 is a block diagram illustrating a vehicle implementing the present embodiment. The vehicle 200 may include a control device 210, an acceleration device 230, a braking device 240, a steering device 250, a sensing device 260, and an engine 270. The devices presented are only illustrative, and not all devices are essential. The vehicle 200 may further include additional devices, or specific devices may be omitted. Some of the devices may have their own processors, and perform processing related to the specific function of that device.

The acceleration device 230 may be a mechanism which is configured to accelerate the vehicle 200. The braking device 240 may be a mechanism which is configured to decelerate the vehicle 200. The steering device 250 may be a mechanism which is configured to adjust the direction of the vehicle 200. The vehicle 200 may accelerate through the acceleration device 230, decelerate through the braking device 240, and change a driving direction through the steering device 250. At least any one of the acceleration device 230, the braking device 240, and the steering device 250 may be controlled by the control device 210 and/or an additional controller in order to control the speed and direction of the vehicle 200.

The sensing device 260 may include one or more sensors configured to sense information regarding the location/speed of the vehicle 200 and/or the environment of the vehicle 200. The sensing device 260 may include a location sensor which measures a geographical location of the vehicle 200 and an object detection sensor which recognizes an object around the vehicle 200. The location sensor may include a Global Positioning System (GPS) receiver. The location sensor may further include an accelerometer, a gyroscope, and the like configured to determine the direction and speed of the vehicle 200, and their changes. The object detection sensor may include at least any one of a camera, a radar, an ultrasonic sensor, and an infrared sensor.

The sensing device 260 may include a state sensor which is set to sense a state of the vehicle 200. The state sensor may include at least any one of an inertial navigation unit (IMU) sensor, a collision sensor, a wheel sensor, a speed sensor, a tilt sensor, a weight sensing sensors, a heading sensor, a position module, a vehicle forward/backward sensor, a battery sensor, a fuel sensor, a tire sensor, a steering sensor by handle rotation, a vehicle interior temperature sensor, a vehicle interior humidity sensor, an ultrasonic sensor, an illumination sensor, an accelerator pedal position sensor, and a brake pedal position sensor. The sensing device 260 may acquire sensing signals for vehicle posture information, vehicle motion information, vehicle yaw information, vehicle roll information, vehicle pitch information, vehicle collision information, vehicle direction information, vehicle angle information, vehicle speed information, vehicle acceleration information, vehicle tilt information, vehicle forward/backward information, battery information, fuel information, tire information, vehicle lamp information, vehicle interior temperature information, vehicle interior humidity information, steering wheel rotation angle, vehicle exterior illumination, a pressure applied to the accelerator pedal, a pressure applied to the brake pedal, and the like.

The control device 210 may exchange various information by communicating with the acceleration device 230, the braking device 240, the steering device 250, and the sensing device 260, or control these devices.

The control device 210 may include a processor 211 and a memory 212. The control device 210 may include one or more sub-devices based on the function, and each sub-device may include at least one of the processor and the memory, and may be configured to perform processing related to the function of the corresponding sub-device. For example, the control device 210 may include a telematics control unit (TCU) which is responsible for communication between the interior and the exterior of the vehicle 200. The control device 210 may include an autonomous driving device which is responsible for autonomous driving. The control device 210 may include an infotainment system or an Audio Video Navigation (AVN) system which displays driving information to passengers or provides various entertainments. According to the following embodiments, the control device 210 may include the TCU or the infotainment system. Alternatively, the control device 210 may also include a combination of the TCU and the infotainment system or a combination of other functions.

The processor 211 may include an application-specific integrated circuit (ASIC), a central processing unit (CPU), an application processor (AP), digital signal processors (DSPs), a microcontroller, a chipset, a logic circuit, a data processing device, and/or a combination thereof. In the software implementation for the following embodiments, a software code which performs the functions described herein may be stored in the memory 212 and processed by the processor 211.

The memory 212 may store information which is accessible by the processor 211. The information may include instructions which are executable by the processor 211 and/or data which are processed by the processor. The memory 212 may include any form of computer-readable medium which operates to store information. For example, the memory 212 may include a read only memory (ROM), a random access memory (RAM), a digital video disc (DVD), an optical disc, a flash memory, a Solid State Drive (SSD), a hard drive, and a combination thereof.

Although the control device 210 is described to include the processor and the memory in one physical block, the control device 210 may include a plurality of processors and a plurality of memories, and may be physically or logically, operatively connected.

The control device 210 may be connected to a display device 280 configured to display information. The display device 280 may include a liquid crystal display (LCD) touch screen or an Organic Light Emitting Diode (OLED) touch screen, and include various sensors (a video camera, a microphone, and the like) configured to detect a passenger's state or gesture.

The control device 210 may be connected to a wireless modem 290 which is set to communicate with other devices. The control device 210 may exchange a wireless signal with mobile devices of the interior/exterior of the vehicle 200 or a server 120 (see FIG. 1) or the surrounding vehicle through the wireless modem 290. There are no limitations to the wireless communication protocol which is supported by the wireless modem 290, and the wireless modem 290 may support various wireless communication protocols such as cellular communication, WiFi, Bluetooth, Zigbee, an infrared link, and the like.

The memory 212 of the control device 210 may have map information and/or driving plan data. The driving plan data may include information on a vehicle trajectory for the vehicle 200 to track the location of the vehicle from the current location to the destination. The driving plan data may be used to guide the trajectory to the driver, or for autonomous driving. The map information may include various maps configured to define the driving environment. The map information may include the shape and elevation of a roadway, a lane line, an intersection, a crosswalk, a speed limit, a traffic signal, buildings, or other objects or information. The map information may further include real-time traffic information, obstructions on the roadway, roadway state information, and the like. The map information and the driving plan data may be updated based on the information which is given by the server 120, or updated based on the information which is detected by the sensing device 260 of the vehicle 200.

The engine 270 provides propulsion to the vehicle 200. The engine 270 may include an internal combustion engine, an electric motor, or a combination thereof.

Now, a modular control device according to an embodiment of the present disclosure will be described based on the aforementioned vehicle 200. The modular control device may functionally correspond to the control device 210 of FIG. 2, and further include at least any one of the other devices of FIG. 2. The modular control device may include a memory and at least two processors.

Figure 3:
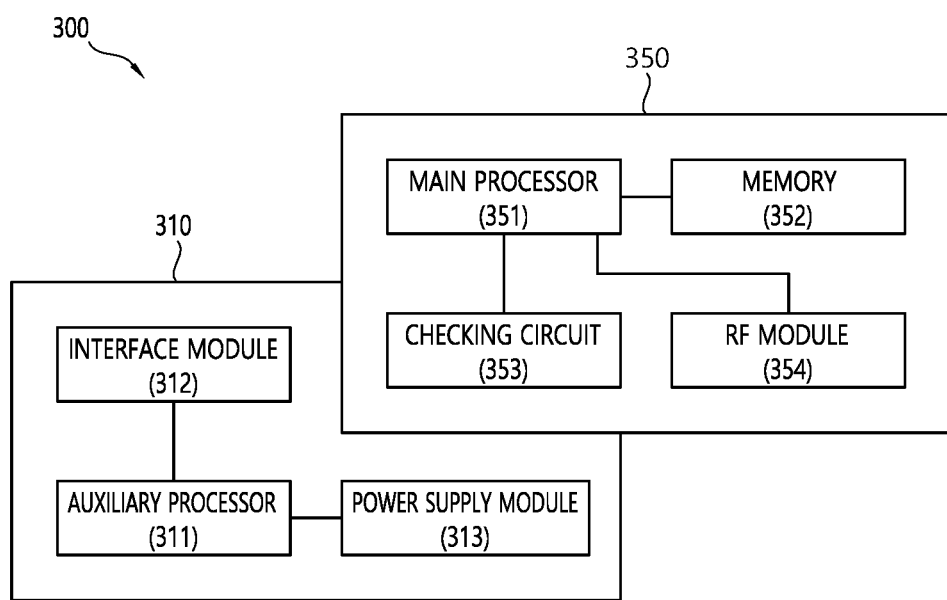
FIG. 3 is a diagram illustrating a modular control device according to an embodiment of the present disclosure.

FIG. 3 is a diagram illustrating a modular control device according to an embodiment of the present disclosure.

A modular control device 300 includes a base block 310 and an upgrade block 350. The base block 310 may be fixed and mounted inside the vehicle. The upgrade block 350 may be detachably mounted to the base block 310. The upgrade block 350 may be replaced based on a function provided by the vehicle.

The base block 310 includes an auxiliary processor 311, an interface module 312, and a power supply module 313.

The auxiliary processor 311 provides connection management with the upgrade block 350 and connection management between the vehicle using the interface module 312 and the upgrade block 350. The function of the base block 310 may be implemented by the auxiliary processor 311. The auxiliary processor 311 may include a microcontroller with relatively low-power consumption. The auxiliary processor 311 may include, but is not limited to, a RH850 microcontroller made by Renesas Electronics.

The interface module 312 provides an interface for communication between the modular control device 300 and in-vehicle devices. The interface module 312 may provide various communication protocols such as Ethernet, a Controller Area Network (CAN), a Local Interconnect Network (LIN), a Universal Serial Bus (USB), a thunderbolt, and the like. The interface module 312 may provide the connection with the vehicle display device 280 (see FIG. 2) so that information provided by the modular control device 300 is displayed on the display device 280 (see FIG. 2).

The power supply module 313 supplies power to the base block 310 and the upgrade block 350. When the base block 310 determines that the upgrade block 350 operates normally, the base block 310 may allow supplying power to the upgrade block 350. The base block 310 may not start power supply to the upgrade block 350 when the upgrade block 350 does not operate normally or an invalid upgrade block 350 is connected. The power supply module 313 may include a battery (not illustrated) for supplying power after the engine is turned off. The power supply module 313 is included in the base block 310, but this is only illustrative. The power supply module 313 may be included in the upgrade block 350, or mounted to a separate module rather than the modular control device 300.

The upgrade block 350 includes a main processor 351, a memory 352, a checking circuit 353, and a radio frequency (RF) module 354.

The main processor 351 may perform a function of the modular control device 300 in a vehicle. Some or all of the functions of the control device 210 (see FIG. 2) may be implemented by the main processor 351. The main processor 351 may be replaced with a processor having low processing power or a processor having high processing power based on the given functions. The main processor 351 may consume higher power than that of the auxiliary processor 311 and have higher processing power. The main processor 351 may include various System on Chips (SoCs). For example, the main processor 351 may include a Snapdragon processor made by Qualcomm, but this is only illustrative.

The memory 352 stores instructions and/or applications which are executed by the main processor 351. The memory 352 may include a Universal Flash Storage (UFS), a Low-Power Double Data Rate Synchronous Dynamic Random Access Memory (LPDDR SDRAM), or a combination thereof.

The checking circuit 353 is a circuit configured to physically detect whether the upgrade block 350 to which the base block 310 is mounted may operate normally. When power is first supplied after the upgrade block 350 is coupled to the base block 310, the base block 310 may firstly detect whether the upgrade block 350 can normally operate with the upgrade block 350 through the checking circuit 353 and then detect by software whether the upgrade block 350 can normally operate with the upgrade block 350.

In an embodiment, the checking circuit 353 may include a resistance. The base block 310 may flow a specific current of the checking circuit 353, and measure a voltage to monitor whether the upgrade block 350 is valid. For example, it is assumed that a first upgrade block is set to a first resistance and a second upgrade block is set to a second resistance. The base block 310 may determine the mounted upgrade block as the first upgrade block when the first resistance is recognized by measuring a voltage, and determine the mounted upgrade block as an inoperable (or invalid) upgrade block when no first and second resistances are recognized by measuring the voltage.

In another embodiment, the checking circuit 353 may include one or more switches which identify the upgrade block. For example, it is assumed that the first upgrade block is set to a first switch being ON, and the second upgrade block is set to a second switch being ON. The base block 310 may determine the mounted upgrade block as the first upgrade block when the first switch of the checking circuit 353 of the mounted upgrade block 350 is detected as ON.

The RF module 354 may support various wireless communication protocols such as cellular communication, WiFi, BLUETOOTH, ZIGBEE, and infrared link, and there are no limitations to the supported wireless communication protocols. The RF module 354 may include some or all of the wireless modem 290 (see FIG. 2). The RF module 354 is included in the upgrade block 350, but this is only illustrative. The RF module 354 may be included in the base block 310, or mounted in a separate module rather than the modular control device 300.

A valid upgrade block refers to an upgrade block in a state capable of operating normally with a base block mounted to the vehicle, and an invalid upgrade block refers to an upgrade block in a state capable of not operating normally with the base block mounted to the vehicle. Mounting the invalid upgrade block may means that an unauthorized upgrade block is mounted or a mounting error (separation by impact, arbitrary separation by a user, or the like) occurs. When the invalid upgrade block is detected, the base block may stop supplying power to the upgrade block. The base block may warn the driver or register the invalid upgrade block in a server.

Figure 4:
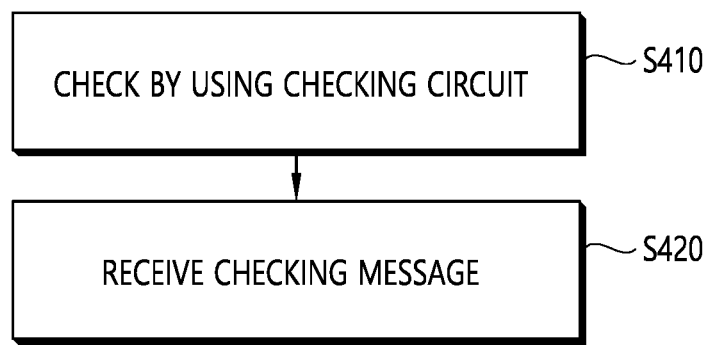
FIG. 4 is a diagram illustrating a method of detecting a valid upgrade block.

FIG. 4 is a diagram illustrating a method of detecting a valid upgrade block. This method may be performed by the auxiliary processor 311 of the base block 310.

In S410, when the upgrade block 350 is newly mounted or power supplying is started, the base block 310 attempts to detect whether the upgrade block is valid through the checking circuit 353 of the upgrade block 350. For example, if the resistance of the valid upgrade block is known as the first resistance, the base block 310 measures a voltage based on a current supplied to the checking circuit 353. The base block 310 may calculate the measured resistance based on the measured voltage and the current, and if the measured resistance is within the error range of the first resistance, the base block may confirm that the upgrade block is valid.

In S420, the base block 310 receives a checking message from the upgrade block 350.

The upgrade block 350 may transmit the checking message to the base block 310 within a specific time after power starts to be supplied. When the checking message is not received or an invalid checking message is received within the specific time, the base block 310 may determine that the upgrade block is not valid. The specific time may be preset to a time between 5 seconds and 60 seconds, but is not limited thereto.

The upgrade block 350 may periodically transmit the checking message after transmitting an initial checking message. This is for detecting the mounting error (separation by an impact, an arbitrary separation by a user) while the upgrade block is operating. When the checking message is not received or an invalid checking message is received within a period, the base block 310 may determine that the upgrade block is not valid. The period may be preset to a time between 5 seconds and 60 seconds, but is not limited thereto. The period may be changed based on the load state of the upgrade block 350.

The checking message may include information on the software version of the upgrade block 350 and/or the hardware version of the upgrade block 350. The hardware version may indicate a hardware configuration (for example, whether an RF module is included) for each mountable upgrade block or information on the main processor. The checking message may include an identifier of the upgrade block 350.

Through a physical detection by the checking circuit 353 and a logical detection by the checking message, the base block 310 may monitor whether the mounted upgrade block 350 is valid. Accordingly, it is possible to prevent an error caused by mounting an invalid upgrade block.

Figure 5:
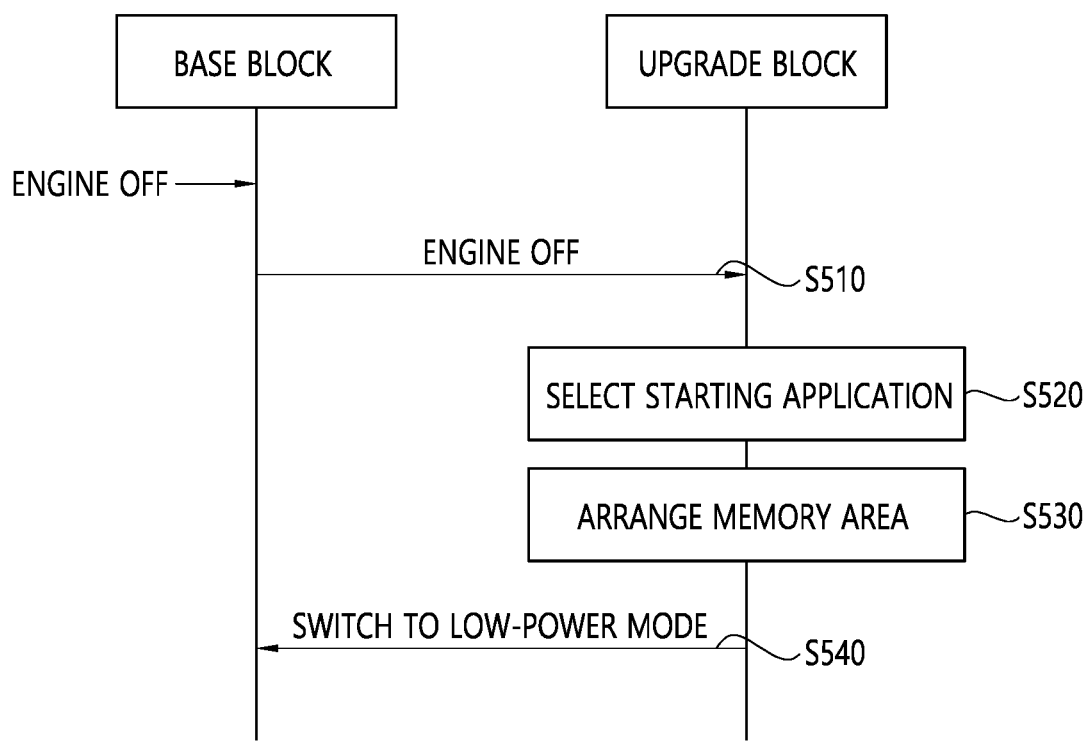
FIG. 5 is a diagram illustrating an operation in a low power consumption mode of the modular control device when an engine of the vehicle is turned off.

FIG. 5 is a diagram illustrating an operation in a low power consumption mode of the modular control device when the engine of the vehicle is turned off.

Upon receiving an engine OFF signal, the base block delivers the engine OFF signal to the upgrade block (S510).

The upgrade block selects one or more applications (this is called as starting application) to be executed upon booting among the executing applications (S520). The starting application may include one or more applications which will be first executed when the engine is turned on. The upgrade block may terminate the remaining applications.

The upgrade block arranges the starting application in the starting area within memory (S530). The memory may include a plurality of storage areas. The area to which power is supplied in the low power consumption mode among the plurality of storage areas is called a starting area. No power is supplied to the remaining storage areas except for the starting area within the memory. The power may be supplied only to the starting area of the upgrade block.

The upgrade block directs the base block to switch to the low power consumption mode (S540). In the low power consumption mode, the base block may periodically check the engine ON state.

Figure 6:
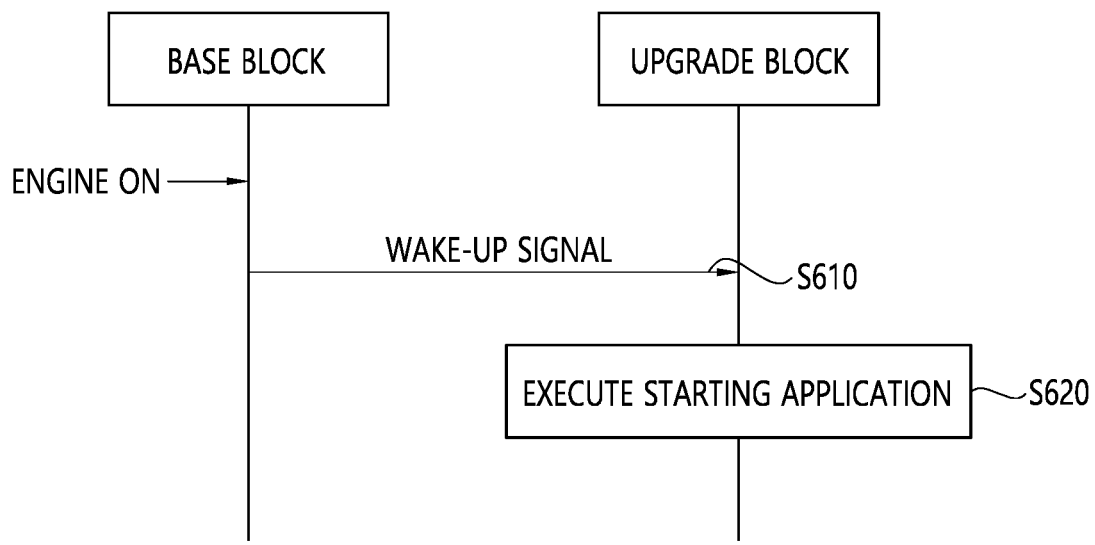

FIG. 6 is a diagram illustrating a booting operation of the modular control device when the engine of the vehicle is turned on.

When the engine ON signal is received, the base block sends a wake-up signal to the upgrade block (S610).

The upgrade block first executes the starting application which is stored in the starting area of the memory (S620). In addition, the upgrade block executes the remaining applications sequentially.

When the engine is turned off, the upgrade block may consume the minimum power in the low power consumption mode, and when the engine is turned on, the upgrade block may provide information to the driver within the minimum time again.

Figure 7:
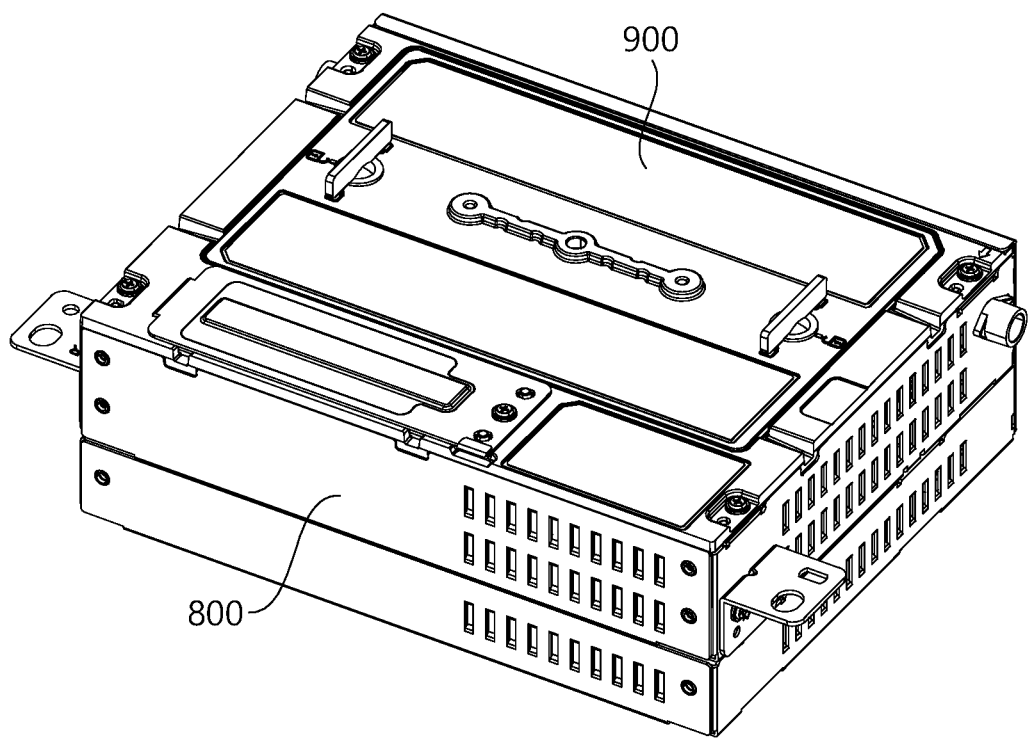
FIG. 7 is a diagram illustrating a frame in which the modular control device is embedded.

FIG. 7 is a diagram illustrating a frame in which the modular control device is embedded.

A frame 700 for the modular control device includes a base frame 800 and an upgrade frame 900. The base frame 800 includes the base block 310. The base block 310 may be mounted to the base frame 800 in the form of a printed circuit board (PCB). The base frame 800 is mounted to be fixed inside the vehicle. The upgrade frame 900 includes the upgrade block 350. The upgrade block 350 may be mounted to the upgrade frame 900 in the form of the PCB. The upgrade frame 900 may be arbitrarily mounted to or detached from the base frame 800.

Figure 8:
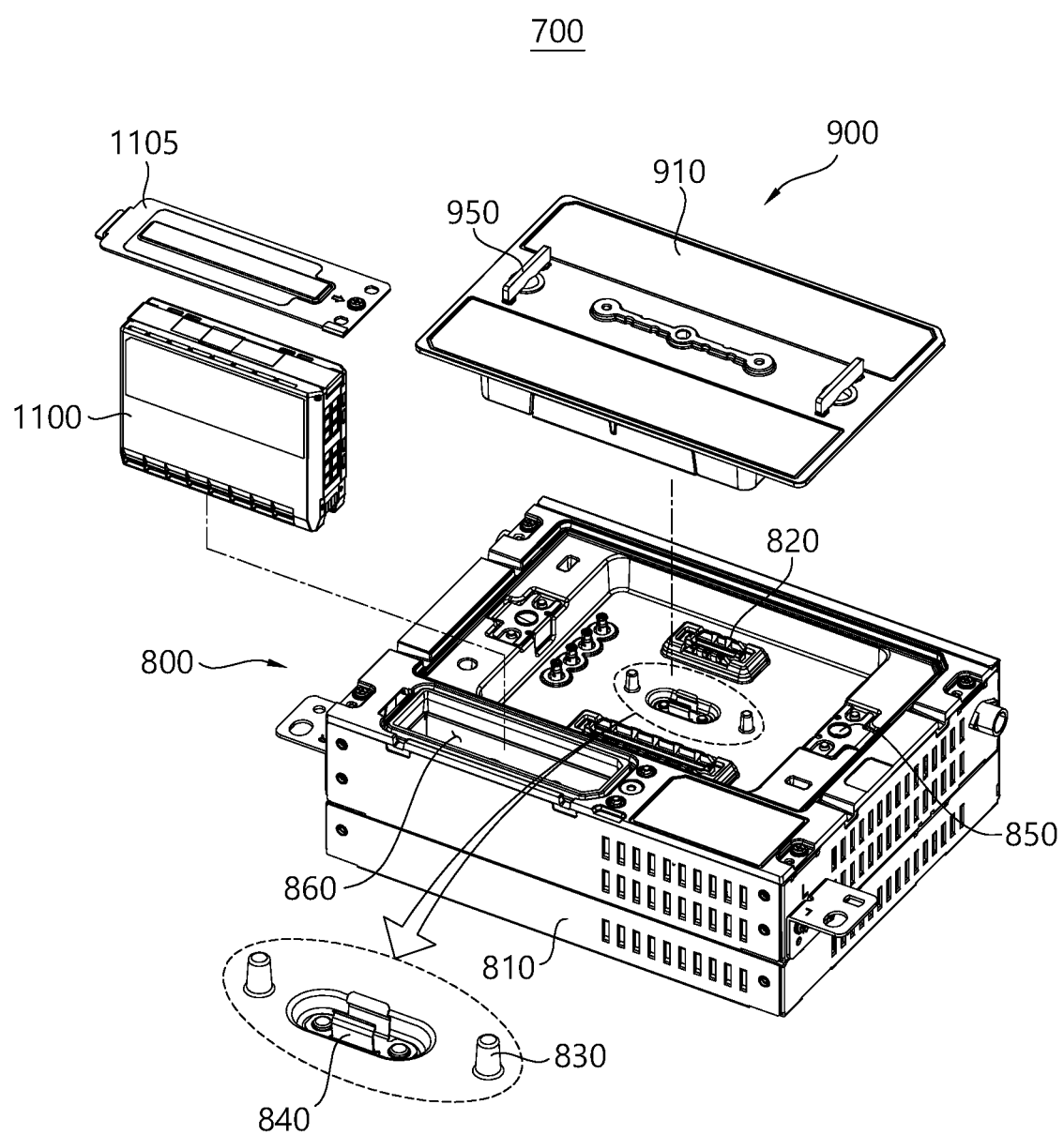
FIG. 8 is an exploded perspective diagram of the frame for the modular control device.
Figure 9:
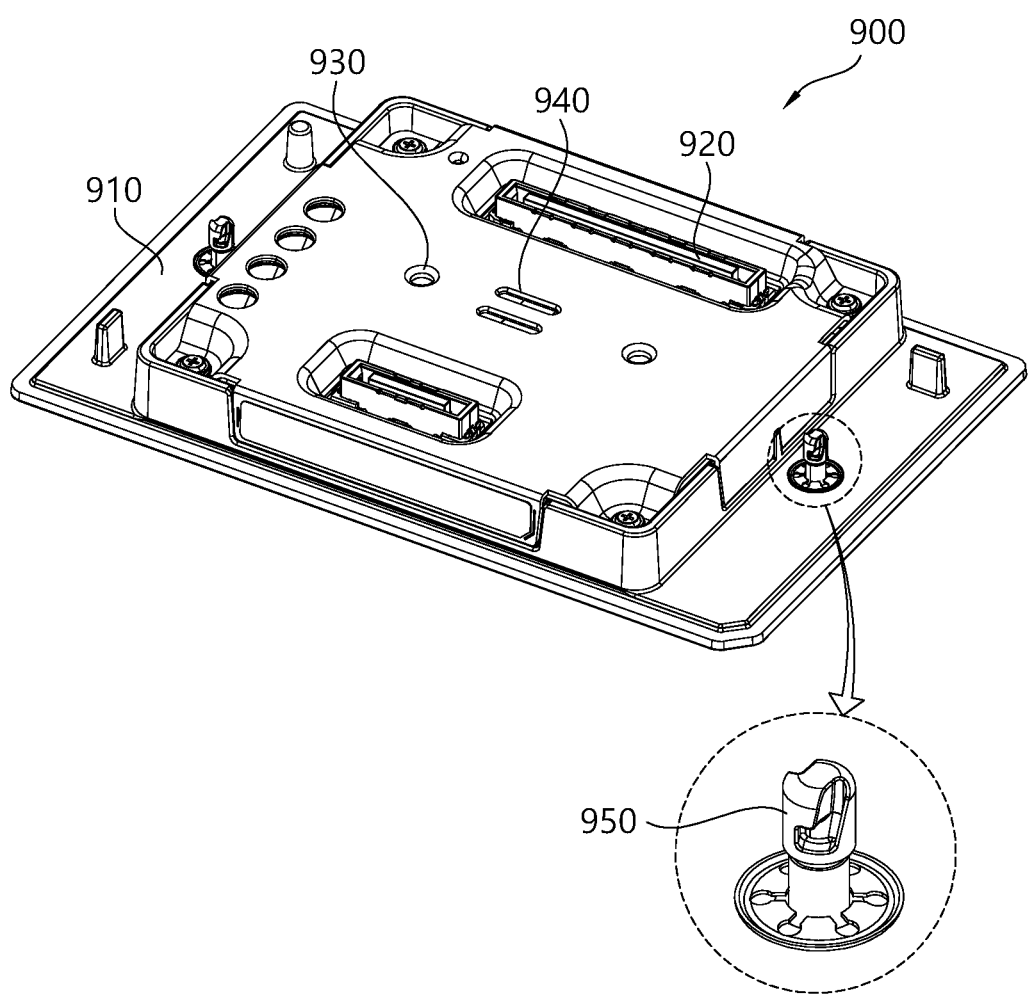
FIG. 9 is a diagram illustrating the bottom surface of an upgrade frame.

FIG. 8 is an exploded perspective diagram of the frame for the modular control device. FIG. 9 is a diagram illustrating the bottom surface of the upgrade frame.

The upgrade frame 900 needs to be easily mounted on or detached from the base frame 800. In addition, when the base frame 800 and the upgrade frame 900 are wrongly connected during the driving of the vehicle, driving information and the like may not be displayed to the driver. Accordingly, it is necessary that the upgrade frame 900 is firmly bound to the base frame 800 in order to prevent the connection from being disconnected even if there is an impact or a vibration during the driving.

The base frame 800 may include a base body 810, one or more connectors 820, a plurality of pins 830, a fasten hook 840, a fasten hole 850, and a battery holder 860.

The upgrade frame 900 may include a body 910, one or more connectors 920, a plurality of holes 930, a hook groove 940, and a fasten lever 950.

A PCB on which the base block 310 is implemented is mounted to the inside of the base body 810. A PCB on which the upgrade block 350 is implemented is mounted to the inside of the body 910 of the upgrade frame 900. The connector 820 of the base frame 800 is connected to the connector 920 of the upgrade frame 900.

The plurality of pins 830 of the base frame 800 are inserted into the plurality of holes 930 of the upgrade frame 900 so that the upgrade frame 900 is coupled to the base frame 800 at the correct location. The number of the plurality of pins 830 is two, but this is only illustrative, and may be three or four.

The fasten hook 840 of the base frame 800 is inserted into the hook groove 940 of the upgrade frame 900 so that the upgrade frame 900 is fixed to the base frame 800. The fasten hook 840 of the base frame 800 includes a pair of plates. The end of each plate is bent and inserted into the hook groove 940.

The upper end of the fasten lever 950 of the upgrade frame 900 includes a handle rotatable by the user, and the lower end thereof includes a pin which is inserted into the fasten hole 850 of the base frame 800. The pin of the fasten lever 950 is formed with a hole in a spiral shape. As the fasten lever 950 rotates, the projection of the fasten hole 850 is firmly coupled to this hole.

A battery 1100 which will supply power in the low power consumption mode is inserted into the battery holder 860 of the base frame 800. A battery cover 1105 is assembled to the base body 810 to protect the battery 1100.

When the fasten lever 950 is released, the upgrade frame 900 may be separated from the base frame 800. When the fasten lever 950 is fastened, the upgrade frame 900 is fixed to the base frame 800.

What is claimed is:

1. A modular control device for a vehicle, the modular control device comprising:
    a base frame which is mounted to the vehicle and provides first functions to the vehicle; and
    an upgrade frame which is mounted detachably to the base frame and provides second functions to the vehicle,
    wherein the base frame is mounted with a first printed circuit board (PCB) on which a base block is implemented, the base block providing interfaces with devices in the vehicle, the base block including an auxiliary processor for monitoring that an upgrade block can normally operate with the base block,
    wherein the upgrade frame is mounted with a second PCB on which the upgrade block is implemented, the upgrade block including a memory and a main processor, and
    wherein the base frame comprises:
        a position matching unit for matching a position between the base frame and the upgrade frame when the upgrade frame is mounted to the base frame; and
        a fasten unit for detachably binding the upgrade frame with the base frame; and
    a connector for connecting the base frame with the upgrade frame to monitor that the upgrade block can normally operate with the base block,
    wherein the base block stops supplying power to the upgrade block when the auxiliary processor detects that the upgrade block does not operate with the base block.

2. The modular control device of claim 1, wherein the base frame further comprises a battery holder into which a battery that is used to supply a power while the main processor is operating in a low power consumption mode is to be inserted.

3. The modular control device of claim 1, wherein the auxiliary processor is configured to periodically receive a checking message from the main processor to confirm that the upgrade block normally operates with the base block while a power is supplied to the upgrade block.

4. The modular control device of claim 1, wherein, when power is first supplied after the upgrade block is coupled to the base block, the base block firstly detects whether the upgrade block can normally operate with the base block through a checking circuit, and then detects by software whether the upgrade block can normally operate with the upgrade block.

5. A base frame for a modular control device for a vehicle, the base frame comprising:
- a base body which is mounted with a printed circuit board (PCB) on which a base block is implemented, and to which an upgrade frame on which an upgrade block is implemented is detachably mounted, the base block providing interfaces with devices in the vehicle, the base block including an auxiliary processor for monitoring that the upgrade block can normally operate with the base block;
- a position matching unit for matching a position between the base frame and the upgrade frame when the upgrade frame is mounted to the base frame;
- a fasten unit for detachably binding the upgrade frame with the base frame; and
- a connector for connecting the base frame with the upgrade frame to monitor that the upgrade block can normally operate with the base block,
- wherein the base block stops supplying power to the upgrade block when the auxiliary processor detects that the upgrade block does not operate with the base block.

6. The base frame of claim 5, wherein the base frame further comprises a battery holder into which a battery that is used to supply a power while the main processor is operating in a low power consumption mode is to be inserted.

7. The base frame of claim 5, wherein the auxiliary processor is configured to periodically receive a checking message from the main processor to confirm that the upgrade block normally operates with the base block while a power is supplied to the upgrade block.

8. The base frame of claim 5, wherein, when power is first supplied after the upgrade block is coupled to the base block, the base block firstly detects whether the upgrade block can normally operate with the base block through a checking circuit, and then detects by software whether the upgrade block can normally operate with the upgrade block.

9. A vehicle comprising:
- an engine;
- a display device which displays driving information of the vehicle to a driver; and
- a modular control device which provides the driving information to the display device,
- wherein the modular control device comprises
- a base frame which is mounted to the vehicle and provides first functions to the vehicle; and
- an upgrade frame which is mounted detachably to the base frame and provides second functions to the vehicle,
- wherein the base frame is mounted with a first printed circuit board (PCB) on which a base block is implemented, the base block providing interfaces with devices in the vehicle, the base block including an auxiliary processor for monitoring that an upgrade block can normally operate with the base block,
- wherein the upgrade frame is mounted with a second PCB on which the upgrade block is implemented, the upgrade block including a memory and a main processor, and
- wherein the base frame comprises:
- a position matching unit for matching a position between the base frame and the upgrade frame when the upgrade frame is mounted to the base frame;
- a first fasten unit for detachably binding the upgrade frame with the base frame; and
- a connector for connecting the base frame with the upgrade frame to monitor that the upgrade block can normally operate with the base block,
- wherein the base block stops supplying power to the upgrade block when the auxiliary processor detects that the upgrade block does not operate with the base block.

10. The vehicle of claim 9, wherein the base frame further comprises a battery holder into which a battery that is used to supply a power while the main processor is operating in a low power consumption mode is to be inserted.

11. The vehicle of claim 9, wherein the auxiliary processor is configured to periodically receive a checking message from the main processor to confirm that the upgrade block normally operates with the base block while a power is supplied to the upgrade block.

12. The vehicle of claim 9, wherein, when power is first supplied after the upgrade block is coupled to the base block, the base block firstly detects whether the upgrade block can normally operate with the base block through a checking circuit, and then detects by software whether the upgrade block can normally operate with the upgrade block.

* * * * *